(12) United States Patent
Hsieh et al.

(10) Patent No.: US 12,095,012 B2
(45) Date of Patent: Sep. 17, 2024

(54) LIGHT-EMITTING DEVICE (71) Applicants: EPISTAR CORPORATION, Hsinchu (TW); Yenrich Technology Corporation, Hsinchu (TW)

(72) Inventors: Min-Hsun Hsieh, Hsinchu (TW); Kunal Kashyap, Hsinchu (TW)

(73) Assignees: Epistar Corporation, Hsinchu (TW); Yenrich Technology Corporation, Hsinchu (TW)

( * ) Notice: Subject to any disclaimer, the term of this patent is extended or adjusted under 35 U.S.C. 154(b) by 280 days.

(21) Appl. No.: 17/377,784

(22) Filed: Jul. 16, 2021

(65) Prior Publication Data
US 2023/0013841 A1 Jan. 19, 2023

(51) Int. Cl.
*H01L 33/00* (2010.01)
*H01L 33/50* (2010.01)
*H01L 33/54* (2010.01)

(52) U.S. Cl.
CPC .......... *H01L 33/54* (2013.01); *H01L 33/0093* (2020.05); *H01L 33/50* (2013.01); *H01L 33/007* (2013.01); *H01L 2933/0041* (2013.01); *H01L 2933/005* (2013.01)

(58) Field of Classification Search
CPC ......... H01L 33/50; H01L 33/54; H01L 33/58; H01L 33/60; H01L 33/66; G02F 1/133514; G02F 2001/133521; G02F 2001/136222
See application file for complete search history.

(56) References Cited

U.S. PATENT DOCUMENTS

| 8,581,291 | B2* | 11/2013 | Shimokawa | H01L 33/56 |
| | | | | 257/E33.064 |
| 9,876,153 | B2 | 1/2018 | Kuo et al. | |
| 2014/0203317 | A1* | 7/2014 | Shin | H01L 33/387 |
| | | | | 257/98 |
| 2017/0186925 | A1* | 6/2017 | Nakabayashi | H01L 25/0753 |
| 2017/0294566 | A1* | 10/2017 | Hsieh | H01L 33/38 |
| 2018/0175261 | A1* | 6/2018 | Yoo | H01L 33/46 |
| 2019/0378873 | A1* | 12/2019 | Lee | H01L 25/0655 |
| 2020/0313056 | A1 | 10/2020 | Hong | |

FOREIGN PATENT DOCUMENTS

CN 107735872 A * 2/2018 ............. H01L 33/36

* cited by examiner

*Primary Examiner* — Walter H Swanson
*Assistant Examiner* — Jacob T Nelson
(74) *Attorney, Agent, or Firm* — Patterson + Sheridan, LLP (57) ABSTRACT

A light-emitting device includes a semiconductor stack, a first electrode, a second electrode, and a supporting layer. The semiconductor stack includes a first semiconductor layer including a first top surface and a bottom surface, an active layer located on the first semiconductor layer, and a second semiconductor layer located on the active layer and including a second top surface. The first electrode is located on the first top surface. The second electrode is located on the second top surface. The supporting layer includes a first thickness, and directly covers at least 80% of the bottom surface. In a top view, the semiconductor stack includes a maximum length, and a ratio of the maximum length to the first thickness is smaller than 1. The supporting layer has a first thermal expansion coefficient smaller than 80 ppm/° C., and the supporting layer has a Young's modulus between 2~10 GPa.

20 Claims, 9 Drawing Sheets

LIGHT-EMITTING DEVICE

TECHNICAL FIELD

The present disclosure is related to a light-emitting device which includes a supporting layer and manufacturing methods thereof, and especially related to a light-emitting device includes a supporting layer directly covering at least 80% area of a bottom surface the light-emitting device's semiconductor stack and manufacturing methods thereof.

DESCRIPTION OF BACKGROUND ART

Traditionally, the light-emitting devices, such as light-emitting diode (LED), formed by epitaxially growing semiconductor stacks on a substrate are usually singulated by laser dicing. However, while dicing, the substrate such as sapphire suffers from oblique cracking easily so that the substrate of the light-emitting devices ends up having uneven and/or inclined sidewalls and poor light-extraction. Furthermore, because the semiconductor stack is relatively thin compared to the substrate, the aforementioned issue becomes more serious when the size of the light-emitting device becomes smaller, especially when the size of the light-emitting device goes to the micrometer scale (The maximum length of the light-emitting device is about 50~500 μm.). Furthermore, the uneven and/or inclined sidewalls also cause the light field varying from device to device. If the devices with varying light patterns are assembled into displays, the displays usually have varying image qualities and poor batch-to-batch consistency.

Besides, when the light-emitting devices are transferred to and arranged on a target substrate by a smaller pitch, the uneven and/or inclined sidewalls can cause interferences between the adjacent light-emitting devices. Not only because it is hard to pick up the light-emitting devices with the uneven and/or inclined sidewalls but it is also difficult to line up the light-emitting devices on the target substrate precisely because the contours of the light-emitting devices vary along with the uneven and/or inclined sidewalls in the top view.

Removing the substrate from the semiconductor stack is one solution. However, the semiconductor stack is relatively thin compared to the substrate, removing substrate easily cause the stress issues on the semiconductor stack and therefore needs to be supported by another supporting structure when the light-emitting device has a larger size, especially when the light-emitting device reaches the micrometer scale.

Therefore, to form light-emitting devices having improved light extraction and uniform light patterns, especially for the light-emitting device with micrometer scale, is a big challenge.

SUMMARY OF THE DISCLOSURE

The present disclosure discloses a light-emitting device including a semiconductor stack, a first electrode, a second electrode, and a supporting layer. The semiconductor stack includes a first semiconductor layer including a first top surface and a bottom surface; an active layer located on the first semiconductor layer; and a second semiconductor layer located on the active layer and including a second top surface. The first electrode is located on the first top surface. The second electrode is located on the second top surface. The supporting layer includes a first thickness and directly covers at least 80% of the bottom surface. In a bottom view, the semiconductor stack includes a maximum length, and a ratio of the maximum length to the first thickness is smaller than 1. The supporting layer has a first thermal expansion coefficient which is smaller than 80 ppm/° C., and the supporting layer has a Young's modulus which is 2~10 GPa.

The present disclosure also discloses a light-emitting device including a semiconductor stack, a first electrode, a second electrode, a wavelength conversion layer, and a supporting layer. The semiconductor stack includes a first semiconductor layer including a first top surface and a bottom surface; an active layer located on the first semiconductor layer; and a second semiconductor layer located on the active layer and including a second top surface. The first electrode is located on the first top surface. The second electrode is located on the second top surface. The wavelength conversion layer is located under the bottom surface. The supporting layer includes a first thickness and directly covers the bottom surface. In a bottom view, the semiconductor stack includes a maximum length, and a ratio of the maximum length to the first thickness is smaller than 1. The supporting layer has a first thermal expansion coefficient smaller than 80 ppm/° C., and the supporting layer has a Young's modulus which is 2~10 GPa.

The present disclosure discloses a manufacturing method of forming a light-emitting device, and the steps include providing a substrate; forming a semiconductor stack on the substrate, wherein the semiconductor stack includes a first semiconductor layer including a first top surface and a bottom surface, an active layer located on the first semiconductor layer, and a second semiconductor layer located on the active layer and including a second top surface; forming a first electrode on the first top surface; forming a second electrode on the second top surface; and forming a supporting layer including a first thickness and covering at least 80% area of the bottom surface. In a bottom view, the semiconductor stack includes a maximum length, and a ratio of the maximum length to the first thickness is smaller than 1. The supporting layer has a first thermal expansion coefficient smaller than 80 ppm/° C. The supporting layer has a Young's modulus which is 2~10 GPa.

DETAILED DESCRIPTION OF PREFERRED EMBODIMENTS

The embodiments of the present disclosure are illustrated in details, and are plotted in the drawings. The same or the similar parts in the drawings and the specification have the same reference numeral. In the drawings, the shape and thickness of a specific element could be shrunk or enlarged.

Figure 1A:
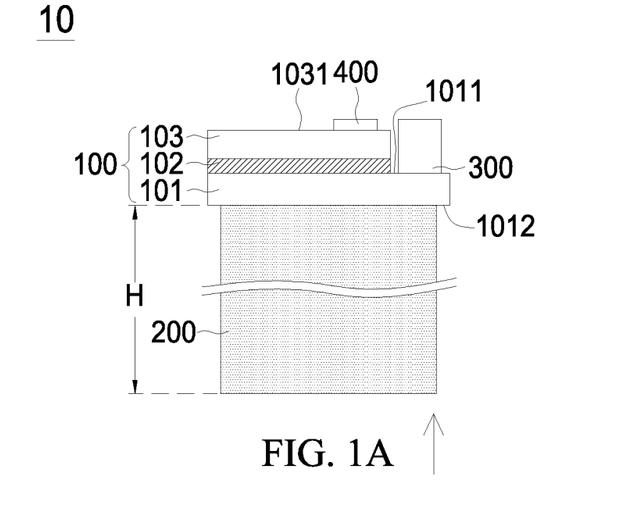
FIG. 1A shows a cross-sectional view of a light-emitting device in accordance with one embodiment of the present disclosure.

FIG. 1A discloses a cross-sectional view of a light-emitting device 10 in accordance with one embodiment of the present disclosure. Light-emitting device 10 includes a semiconductor stack 100 supported by a supporting layer 200, a first electrode 300, and a second electrode 400. The semiconductor stack 100 includes a first semiconductor layer 101 including a first top surface 1011 and a bottom surface 1012, an active layer 102 formed on the first top surface 1011, and a second semiconductor layer 103 formed on the active layer 102 and including a second top surface 1031. The supporting layer 200 is directly formed under the bottom surface 1012. The first electrode 300 is formed on the first top surface 1011. The second electrode 400 is formed on the second top surface 1031.

The first semiconductor layer 101 and the second semiconductor layer 103 provide holes and electrons to recombine in the active layer to emit light. The first semiconductor layer 101, the active layer 102, and the second semiconductor layer 103 can include III-V group semiconductor material, such as $Al_xIn_yGa_{(1-x-y)}N$ or $Al_xIn_yGa_{(1-x-y)}P$, wherein $0 \leq x, y \leq 1$ $(x+y) \leq 1$. Based on the material made of the active layer 102, the semiconductor stack 100 can emit a red light with a peak wavelength or dominant wavelength of 610~650 nm, a green light with a peak wavelength or dominant wavelength of 530~570 nm, a cyan light with a peak wavelength or dominant wavelength of 490~530 nm, a blue light with a peak wavelength or dominant wavelength of 450~490 nm, a purple light with a peak wavelength or dominant wavelength of 400~440 nm, or a UV light with a peak wavelength of 200~400 nm. Although only three layers are illustrated in the semiconductor stack 100, depending on different functional necessity, one or more semiconductor layers can be further included in the semiconductor stack 100.

The supporting layer 200 is composed of a photo imageable material or a dry-etchable material. That is, the shape of the supporting layer 200 can be precisely adjusted according to the demand so that the supporting layer can have smoother sidewalls which have less or no scratches, no harm and/or irregularity caused by laser, and no cleavage plane, and retain a flatter sidewall perpendicular to the bottom surface 1012. The material of the supporting layer 200 can be selected from an organic photoimageable polymer and a dry-etchable material. The organic photoimageable polymer is such as Polyimide (PI), Polybenzoxazole (PBO), Benzo-cyclobutene (BCB), epoxy resin . . . and so on. The dry-etchable material is such as the aforementioned organic photoimageable polymer and an inorganic material. The inorganic material is such as silicone, silicon nitride ($SiN_x$), silicon dioxide ($SiO_2$) . . . and so on. Furthermore, in order to support the semiconductor stack 100, the supporting layer 200 has a first thickness H, and the first thickness H is about 2~6 times of the thickness of the semiconductor stack 100. If the first thickness H is less than 2 times of the thickness of the semiconductor stack 100, the first thickness H is too thin to support the semiconductor stack 100 such that the semiconductor stack 100 may crack during the following manufacturing processes. If the first thickness H is thicker than 6 times of the thickness of the semiconductor stack 100, the supporting layer may be too bulky to affix to the semiconductor stack 100 and easily peeled off in the following manufacturing process. In an embodiment, the semiconductor stack 100 has a thickness of 12 μm, and the supporting layer 200 has the first thickness H of 60 μm.

In order to reduce or remove the stress formed between the semiconductor stack 100 and the supporting layer 200, by selecting an organic photoimageable polymer or a dry-etchable material as a supporting layer 200, the suitable supporting layer 200 may have a first thermal expansion coefficient smaller than 80 ppm/° C. and a Young's modulus smaller than 10 GPa.

In one embodiment, Gallium Nitride (GaN) series layers are used to be the semiconductor stack 100. GaN series material has a thermal expansion coefficient about 5.6 ppm/° C. and a Young's modulus about 180 GPa. The organic photoimageable polymer or the dry-etchable material selected to be the supporting layer 200 has a first thermal expansion coefficient between 50~80 ppm/° C. and a Young's modulus between 2~10 GPa.

Figure 1B:
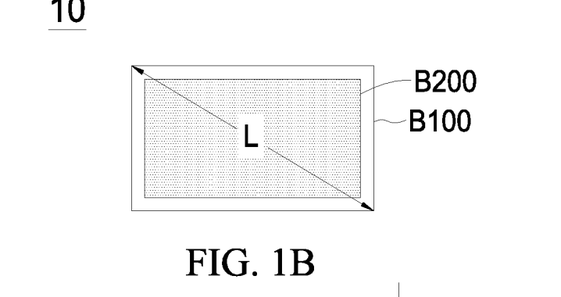
FIG. 1B shows a bottom view of a light-emitting device in accordance with one embodiment of the present disclosure.
Figure 2A:
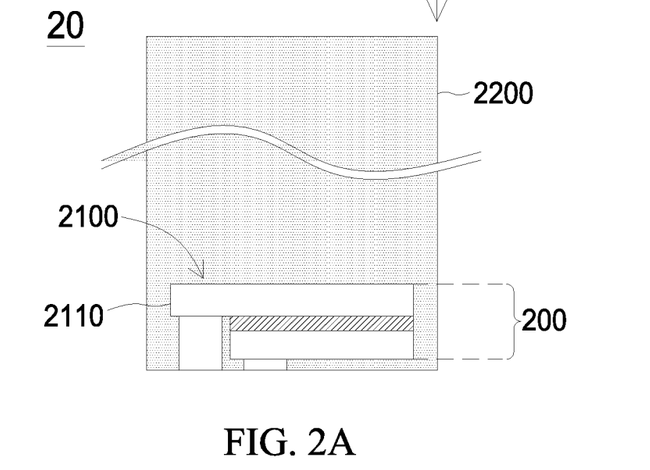
FIGS. 2A~2D show cross-sectional views of light-emitting devices in accordance with another four embodiments of the present disclosure.
Figure 2B:
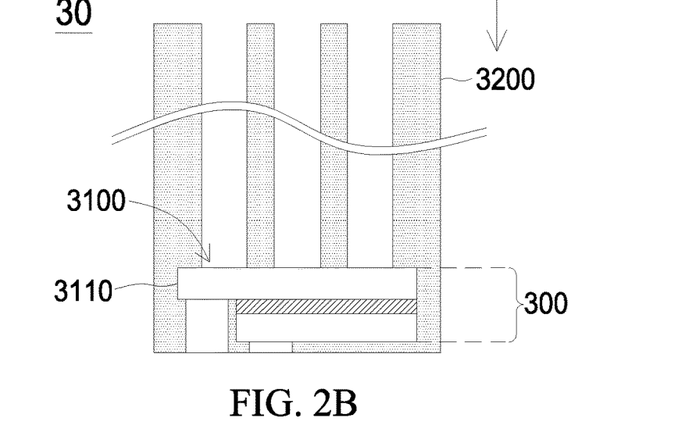
Figure 2C:
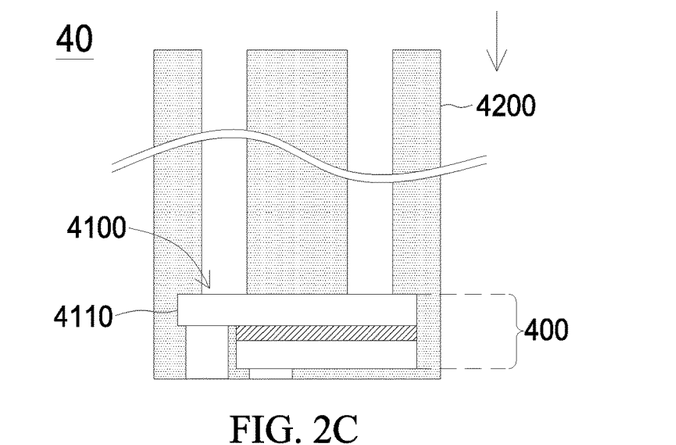
Figure 2D:
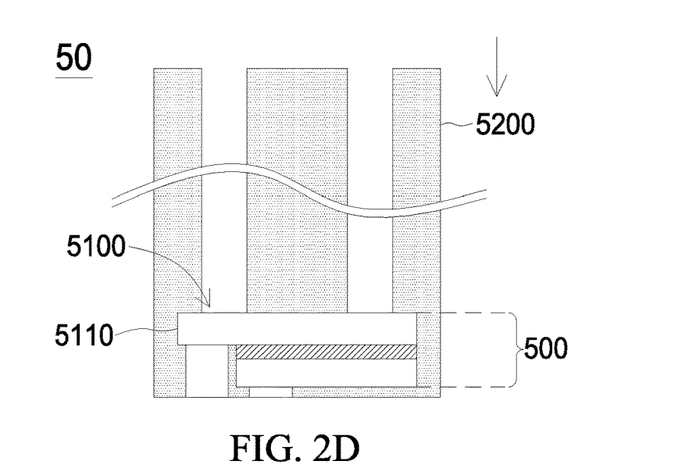
Figure 3A:
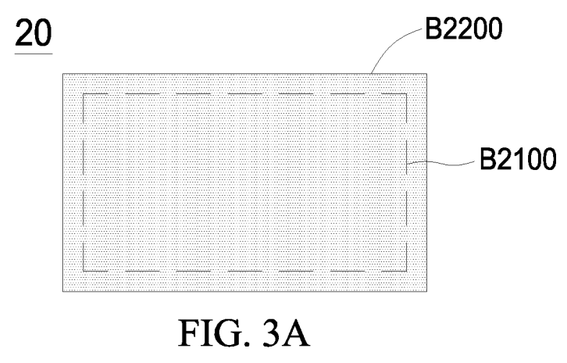
FIGS. 3A~3D show bottom views of light-emitting devices in accordance with another four embodiments of the present disclosure.
Figure 3B:
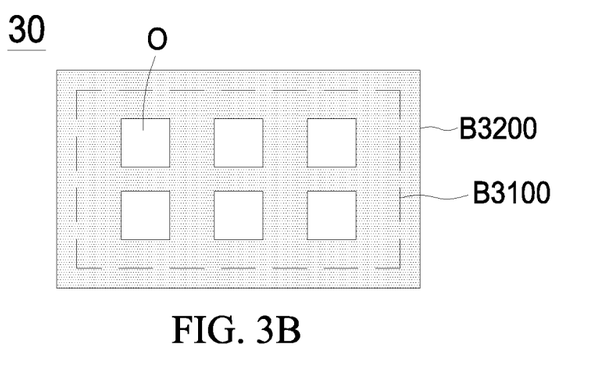
Figure 3C:
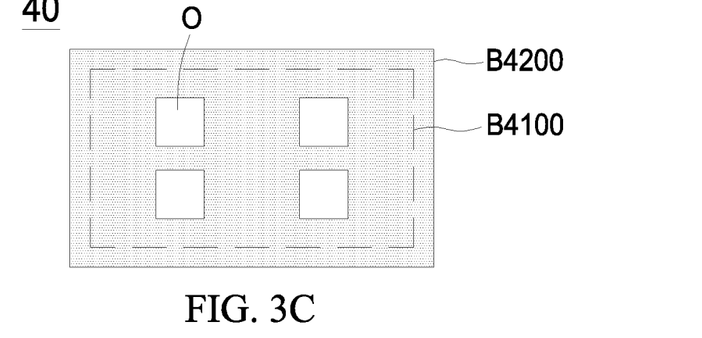
Figure 3D:
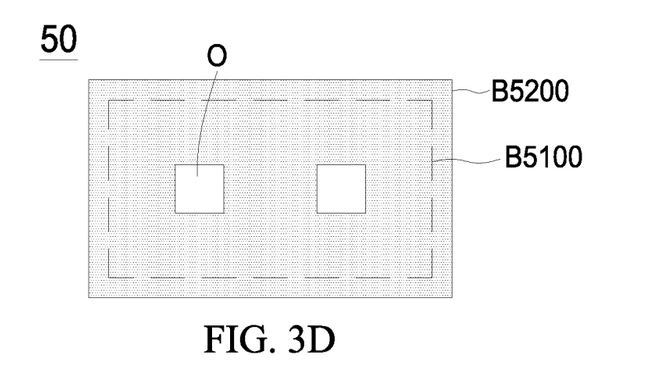

FIG. 1B is a bottom view of the light-emitting device 10 in accordance with one embodiment of the present disclosure, viewed in a direction along the arrow shown in FIG. 1A. As shown in the bottom view, the semiconductor stack 100 includes a first boundary B100, and the supporting layer 200 includes a second boundary B200. The first boundary B100 encompasses the second boundary B200. That is, in the bottom view, the semiconductor stack 100 has an area larger than that of the supporting layer 200, and semiconductor stack 100 includes a boundary located outside the boundary of the supporting layer 200. To facilitate the following transferring processes, at least 80% of the area of the bottom surface 1012 is directly covered by the supporting layer 200 because it is difficult to pick up the light-emitting device 10 if the area of the supporting layer 200 is less than 80% of that of the bottom surface 1012.

Still referring to FIG. 1B, the first semiconductor stack 100 includes a maximum length L (diagonal line of the boundary of the semiconductor stack B100). In one embodiment, in order to form a mechanically robust light-emitting device 10, the ratio of the maximum length L to the first thickness H is smaller than 1. The design is especially suitable for the micrometer scale light-emitting device which has the maximum length L between 50~500 μm.

FIGS. 2A-2D show cross-sectional views of light-emitting devices 20~50 in accordance with another four embodiments of the present disclosure. FIGS. 3A-3D show the bottom views of the light-emitting devices 20~50 as shown in FIGS. 2A~2D.

Referring to FIGS. 2A~2D, the difference between the light-emitting device 10 and the light-emitting devices 20~50 is that the side surfaces 2110/3110/4110/5110 of the semiconductor stack 2100/3100/4100/5100 are covered by the supporting layer 2200/3200/4200/5200 supporting.

Referring to FIGS. 3A~3D, the difference between the light-emitting device 20 and the light-emitting device 30/40/50 is the shape/pattern of the supporting layer 2200. In the four embodiments, the semiconductor stack 2100/3100/ 4100/5100 has a boundary B2100/B3100/B4100/B5100 (drawn in dash lines), and the supporting layer 2200/3200/ 4200/5200 has a boundary B2200/B3200/B4200/B5200 (drawn in solid lines). Since the supporting layer 2200/3200/ 4200/5200 is larger enough to enclose at least the side surfaces 2110/3110/4110/5110 of the semiconductor stack 100, the boundary B2200/B3200B4200/B5200 is located outside the boundary B2100/B3100/B4100/B5100.

In the bottom view, the light-emitting device 20 has a solid supporting layer 2200, while the light-emitting devices 30, 40, and 50 have hollow supporting layers 3200, 4200, and 5200 with several openings O which are beneficial to release the stress formed at the corners of the light-emitting devices. The openings can distribute the total inner stress within the supporting layers 3200, 4200, and 5200 to the corners. For the people with ordinary skill in the art, it is realized that the number and the shape of the opening are not limited to the aforementioned embodiments. The opening(s) within the hollow supporting layer can have a shape of circle, triangle, rectangle, square and another polygon. so on in order to further control the light convergency.

In one embodiment, in the bottom view of a light-emitting device, the supporting layer includes a plurality of openings with different shapes.

Figure 4:
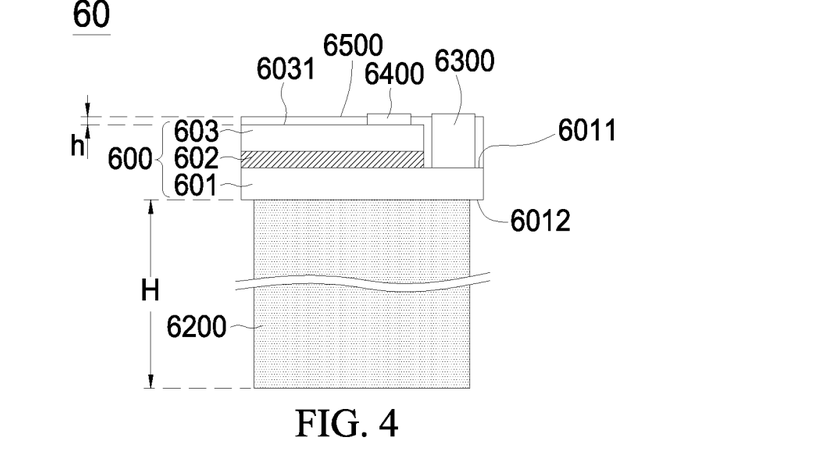
FIG. 4 shows a cross-sectional view of a light-emitting device in accordance with another embodiment of the present disclosure.

FIG. 4 discloses a cross-sectional view of a light-emitting device 60 in accordance with another embodiment of the present disclosure. The light-emitting device 60 includes a semiconductor stack 600 supported by a supporting layer 6200, a first electrode 6300, and a second electrode 6400. The semiconductor stack 600 includes a first semiconductor layer 601 including a first top surface 6011 and a bottom surface 6012, an active layer 602 formed on the first top surface 6011, and a second semiconductor layer 603 formed on the active layer 602 and including a second top surface 6031. The supporting layer 6200 is directly formed under the bottom surface 6012. The first electrode 6300 is formed on the first top surface 6011. The second electrode 6400 is formed on the second top surface 6031.

The light-emitting device 60 further includes a second supporting layer 6500 covering the second top surface 6031. The second supporting layer 6500 includes a second thickness h and a second thermal expansion coefficient. The second supporting layer 6500 can not only support the semiconductor stack 600 but also protect the semiconductor stack 600 from exposing to the external attack such as the pick-and-place process.

Besides, considering the following bonding process, in this embodiment, the second thickness h is smaller than the thickness of the first electrode 6300 and/or the second electrode 6400 such that the first electrode 6300 and/or the second electrode 6400 can project from the top of the second supporting layer 6500 for bonding to an external circuit. In such a configuration, the second thickness h is smaller than the first thickness H, and the second thermal expansion coefficient is larger than the first thermal expansion coefficient, the internal stress between the supporting layer 6200, the second supporting layer 6500 and the semiconductor stack 600 can be balanced or removed.

In another embodiment, the light-emitting device 10/20/ 30/40/50/60 can further include an adhesive layer (not shown) located between the semiconductor stack 100/200/ 300/400/500/600 and the supporting layer 200/2200/3200/ 4200/5200/6200 such that the adhesion between the semiconductor stack and the supporting layer can be improved. The material of the adhesive layer is a kind of insulating layer selected from $SiO_2$, $SiN_x$, $TiO_2$, $TiN_x$ . . . and so on.

The adhesive layer has a thickness between 150~500 nm, and is transparent to light from the semiconductor stack.

Figure 5A:
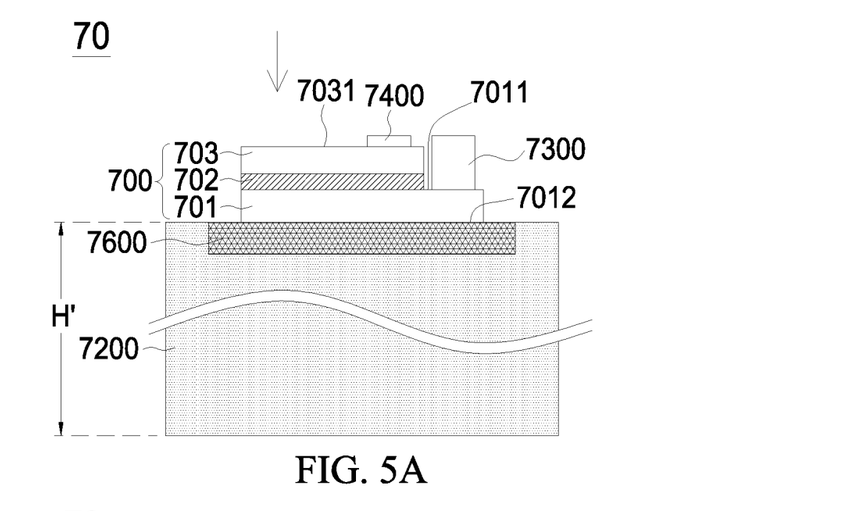
FIG. 5A shows a cross-sectional view of a light-emitting device in accordance with another embodiment of the present disclosure.

FIG. 5A discloses a cross-sectional view of a light-emitting device 70 in accordance with still another embodiment of the present disclosure. Light-emitting device 70 includes a semiconductor stack 700 supported by a wavelength conversion layer 7600 and a supporting layer 7200, a first electrode 7300, and a second electrode 7400. The semiconductor stack 700 includes a first semiconductor layer 701 including a first top surface 7011 and a bottom surface 7012, an active layer 702 formed on the first top surface 7011, and a second semiconductor layer 703 formed on the active layer 702 and including a second top surface 7031. The wavelength conversion layer 7600 is located under the bottom surface 7012. The supporting layer 7200 is also formed under the bottom surface 7012 and directly covers the wavelength conversion layer 7600. The first electrode 7300 is formed on the first top surface 7011. The second electrode 7400 is formed on the second top surface 7031.

The supporting layer 7200 is composed of a photoimageable material or a dry-etchable material. The material of the supporting layer 7200 can be referred to the aforementioned paragraphs related to the material of the supporting layer 200, the supporting layer 7200 has a first thickness H', which is 2~6 times of the thickness of the semiconductor stack 700. If the first thickness H' is less than 2 times of the thickness of the semiconductor stack 700, the first thickness H' is too thin to support the semiconductor stack 700 such that the semiconductor stack 700 may crack during the following manufacturing processes. If the first thickness H' is thicker than 6 times of the thickness of the semiconductor stack 700, the supporting layer may be too bulky to affix to the semiconductor stack 700 and easily peeled off in the following manufacturing process.

The wavelength conversion layer 7600 is composed of a photoimageable material such as a quantum-dot photoimageable resist, a phosphor contained photoimageable resist . . . and so on. To achieve a required wavelength converting efficiency (the optical density value (OD value) is larger than 1 after the light emitted by the semiconductor stack passing through the wavelength conversion layer), the wavelength conversion layer encompasses the bottom surface of the semiconductor stack and has a thickness of at least 2 µm.

Figure 5B:
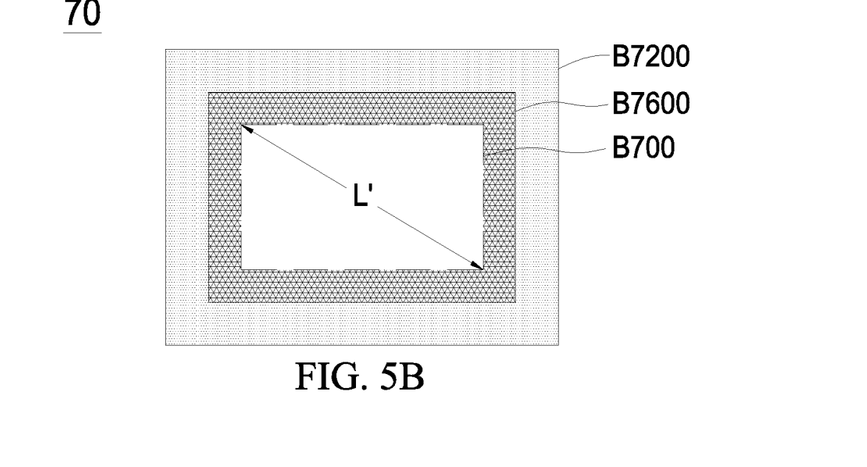
FIG. 5B shows a top view of a light-emitting device in accordance with another embodiment of the present disclosure.

FIG. 5B is a top view of the light-emitting device 70 in accordance with one embodiment of the present disclosure, viewed in the direction along the arrow shown in FIG. 5A. Referring to FIG. 5B, the semiconductor stack 700 includes a first boundary B700, the wavelength conversion layer 7600 includes a second boundary B7600, and the supporting layer 7200 includes a third boundary B7200. The second boundary B7600 encompasses the first boundary B700, and the third boundary B7600 encompasses the second boundary B7200. That is, from the top view, the wavelength conversion layer 7600 is larger than the semiconductor stack 700, the supporting layer 7200 is larger than the wavelength conversion layer 7600, and therefore the second boundary B7200 is located outside the first boundary B700 of the semiconductor stack 700.

Still referring to FIG. 5B, in the top view, the first semiconductor stack 700 includes a maximum length L' (diagonal line of the first boundary B700). In one embodiment, in order to form a mechanically robust light-emitting device 70, the ratio of the maximum length L' to the first thickness H' is smaller than 1. The configuration is especially suitable for the light-emitting device with micrometer scale which has the maximum length L' between 50~500 m.

In order to eliminate or reduce the stress formed between the semiconductor stack 700 and the supporting layer 7200, by selecting an organic photoimageable polymer or a dry-etchable material as a supporting layer 7200, the suitable supporting layer 7200 may have a first thermal expansion coefficient smaller than 80 ppm/° C. and a Young's modulus smaller than 10 GPa.

In one embodiment, GaN series material(s) are used to in the semiconductor stack 700. GaN series material has a thermal expansion coefficient about 5.6 ppm/° C. and a Young's modulus about 180 GPa. The organic photoimageable polymer or the dry-etchable material used in the supporting layer 7200 has a first thermal expansion coefficient between 50~80 ppm/° C. and a Young's modulus between 2~10 GPa.

Figure 6A:
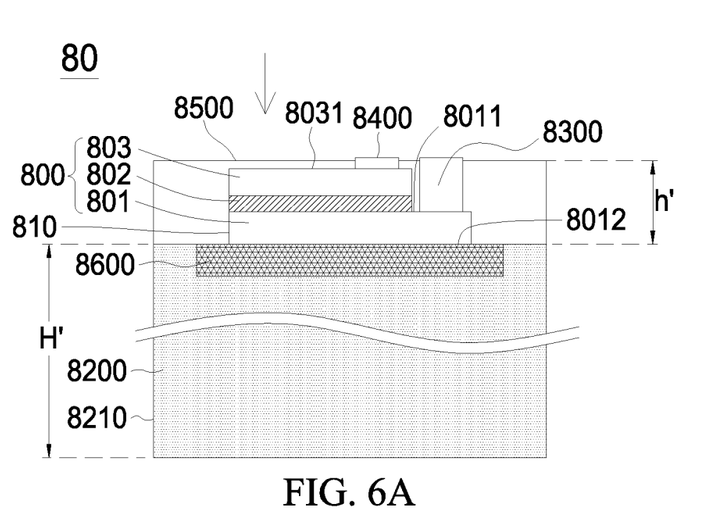
FIG. 6A shows a cross-sectional view of a light-emitting device in accordance with another embodiment of the present disclosure.

FIG. 6A discloses a cross-sectional view of a light-emitting device 80 in accordance with another embodiment of the present disclosure. Light-emitting device 80 includes a semiconductor stack 800 supported by a wavelength conversion layer 8600 and a supporting layer 8200, a first electrode 8300, and a second electrode 8400. The semiconductor stack 800 includes a first semiconductor layer 801 including a first top surface 8011 and a bottom surface 8012, an active layer 802 formed on the first top surface 8011, and a second semiconductor layer 803 formed on the active layer 802 and including a second top surface 8031. Furthermore, the semiconductor stack 800 includes a side surface 810. The wavelength conversion layer 8600 is located under the bottom surface 8012. The supporting layer 8200 is also formed under the bottom surface 8012 and directly covers the wavelength conversion layer 8600. The first electrode 8300 is formed on the first top surface 8011. The second electrode 8400 is formed on the second top surface 8031. The supporting layer 8200 has a first thickness H'.

The light-emitting device 80 further includes a second supporting layer 8500 covering the second top surface 8031 and the side surfaces 810. The second supporting layer 8500 has a second thickness h' and a second thermal expansion coefficient. The second supporting layer 8500 can not only support the semiconductor stack 800 but also protect the semiconductor stack 800 from exposing to the external attack such as the following light-emitting device 80 pick-and-place process.

Besides, considering the following bonding process, in this embodiment, the second thickness h' is designed to be smaller than the sum of the thickness of the second electrode 8400 and the thickness of the semiconductor stack 800. That is, the second thickness h' is smaller than the first thickness H' and therefore the second thermal expansion coefficient is larger than the first thermal expansion coefficient, the internal stress between the supporting layer 8200, the second supporting layer 8500 and the semiconductor stack 800 can be balanced or removed.

Figure 6B:
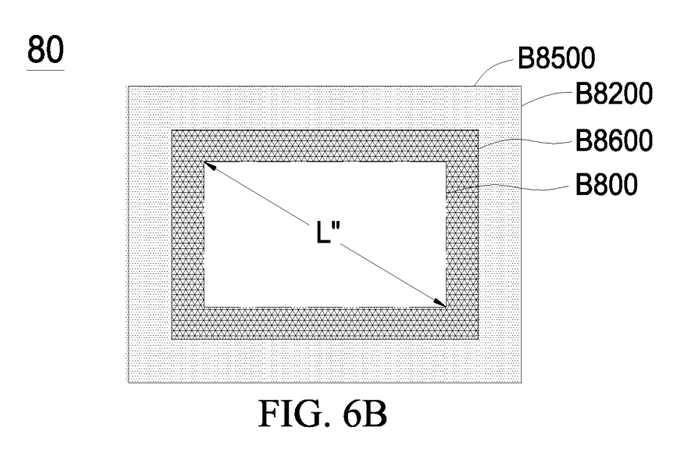
FIG. 6B shows a top view of a light-emitting device in accordance with another embodiment of the present disclosure.

FIG. 6B is a top view of the light-emitting device 80 in accordance with one embodiment of the present disclosure, viewed in the direction along the arrow shown in FIG. 6A. In the top view, the semiconductor stack 800 includes a first boundary B800, the wavelength conversion layer 8600 includes a second boundary B8600, the supporting layer 8200 includes a third boundary B8200, and the second supporting layer 8500 includes a fourth boundary B8500. The second boundary B8600 encompasses the first boundary B800, the third boundary B8200 encompasses the second boundary B8600, and the fourth boundary B8500 and the third boundary B8200 have identical or similar outlines. That is, in the top view, the wavelength conversion layer 8600 is larger than the semiconductor stack 800, the supporting layer 8200 and the second supporting layer 8500 have almost the same sizes and are larger than the wavelength conversion layer 8600.

Therefore, referring to the cross-sectional view the light-emitting device 80 shown in FIG. 6A, the supporting layer 8200 includes a first outer surface 8210, the second supporting layer 8500 includes a second outer surface 8510, and the first outer surface 8210 and the second outer surface 8510 are coplanar with each other.

Still referring to FIG. 6B, in the top view, the first semiconductor stack 800 includes a maximum length L" (diagonal line of the first boundary B800). In one embodiment, in order to form a mechanically robust light-emitting device 80, the ratio of the maximum length L" to the first thickness H' is smaller than 1. The configuration is especially suitable for the light-emitting device with micrometer scale which has the maximum length L" between 50~500 μm.

In order to remove or reduce the stress formed between the semiconductor stack 100 and the supporting layer 8200, by selecting an organic photoimageable polymer or a dry-etchable material as a supporting layer 8200, the suitable supporting layer 8200 has a first thermal expansion coefficient between 50~80 ppm/° C. and a Young's modulus between 2~10 GPa.

Figure 7A:
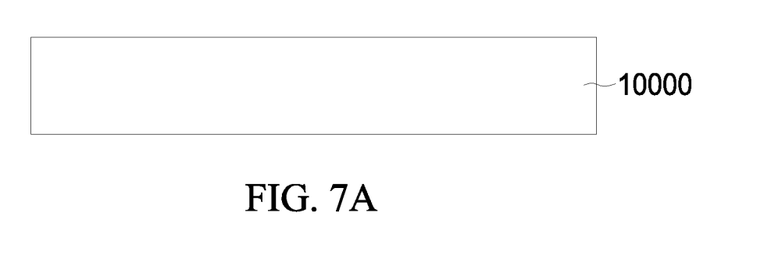
FIGS. 7A~7H show steps of manufacturing the light-emitting device in FIGS. 1A~1B in accordance with embodiments of the present disclosure.
Figure 7B:
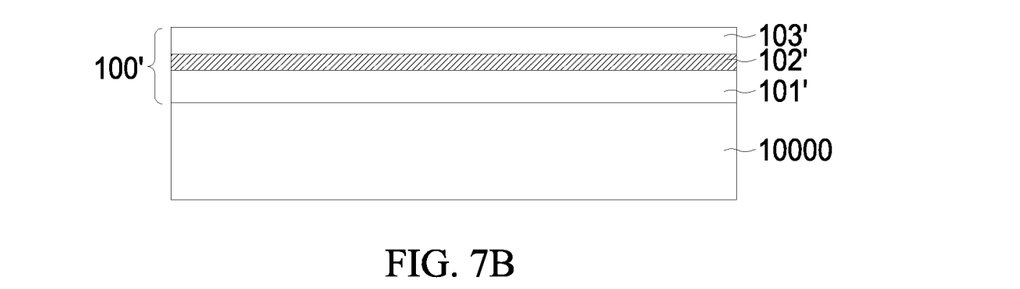
Figure 7C:
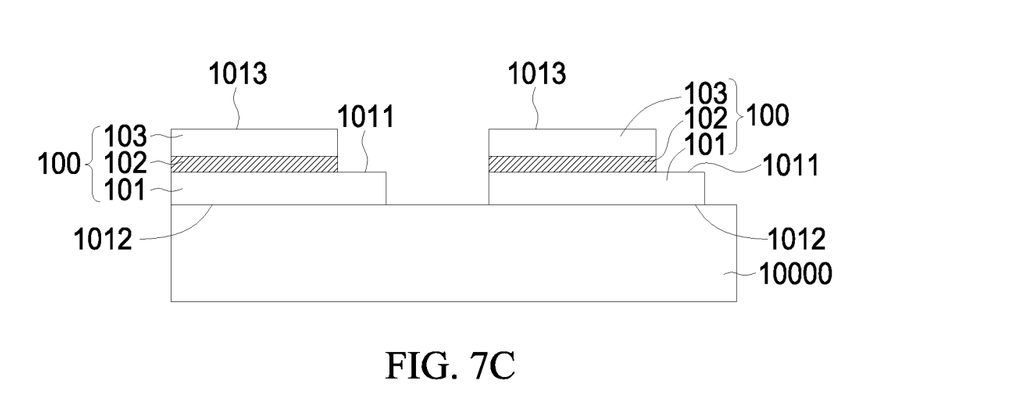
Figure 7D:
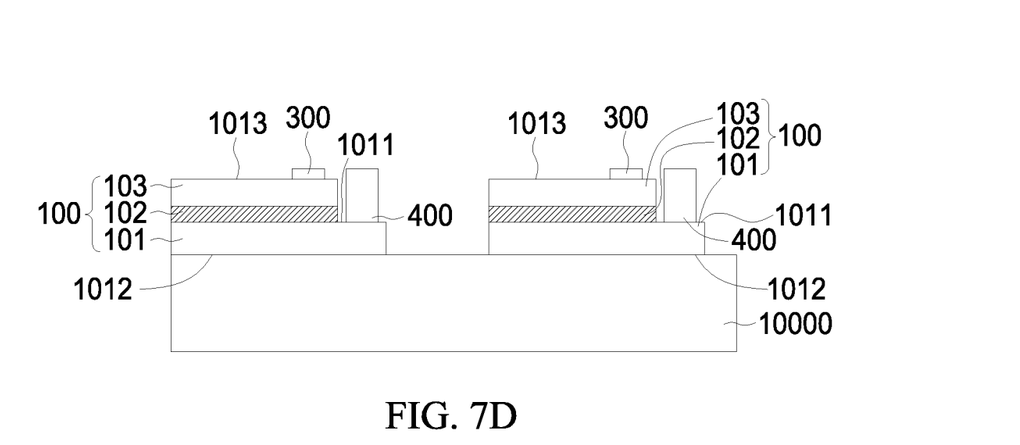

FIGS. 7A-7H show the steps of manufacturing the light-emitting device 10 shown in FIGS. 1A~1B. Referring to FIG. 7A, a substrate 10000 is provided. In one embodiment, the substrate 10000 is made of sapphire. Referring to FIG. 7B, a semiconductor stack 100' is formed on the substrate 10000. In one embodiment, the semiconductor stack 100' is formed through several steps including epitaxially forming a GaN series first semiconductor layer 101' on the substrate 10000 by Metal Organic Chemical Vapor Deposition (MOCVD), epitaxially forming a GaN series active layer 102' on the first semiconductor layer 101' by MOCVD, and epitaxially forming a GaN series second semiconductor layer 103' on the active layer 102' by MOCVD. Referring to FIG. 7C, the semiconductor stack 100' is patterned and separated into a plurality of semiconductor stacks 100. In one embodiment, the semiconductor stacks 100 are formed by Inductively Coupled Plasma Etching (ICP). Each semiconductor stack 100 includes a first semiconductor layer 101 with a first top surface 1011 and a bottom surface 1012, an active layer 102 located on the first semiconductor layer 101, and a second semiconductor layer 103 located on the active layer 102 and having a second top surface 1013. Referring to FIG. 7D, a first electrode 300 is formed on the first top surface 1011, and a second electrode 400 is formed on the second top surface 1013. In one embodiment, the first electrode 300 and the second electrode 400 are formed on the first semiconductor layer 101 and the second semiconductor layer 103 by E-beam Evaporation, respectively.

Figure 7E:
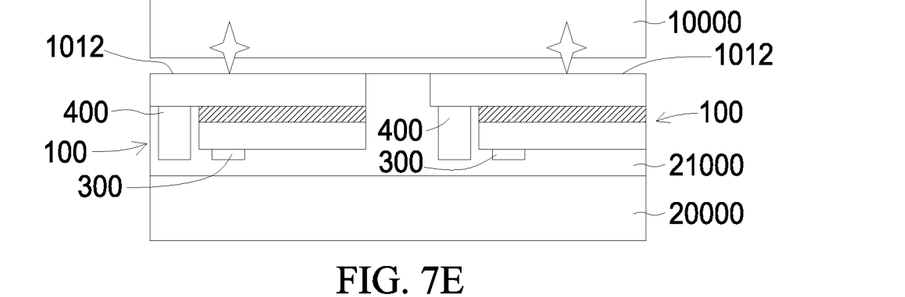

Referring to FIG. 7E, a first temporary carrier 20000 with a top surface is provided. A bonding layer 21000 is provided to cover all the top surface. The plurality of semiconductor stacks 100 formed on the substrate 10000 are bonded to the bonding layer 21000. The semiconductor stacks 100 are separated from the substrate 10000 through a laser lift-off process by irradiating the interface between the substrate 10000 and the semiconductor stacks 100 with laser beams. In one embodiment, the GaN series semiconductor stacks 100 are bonded onto a bonding layer 21000 such as a BCB layer. Then, GaN series semiconductor stacks 100 are separated from the substrate 10000 by using an Nd:YAG third harmonic laser to irradiate the interface therebetween with laser beams having a wavelength of 355 nm through the substrate 10000, and therefore the bottom surface 1012 of each GaN series semiconductor stack 100 is exposed. However, the material of the bonding layer is not limited to BCB, the bonding material can also be such as silicone resin, epoxy resin, PI . . . and so on, and the type of the laser is not limited to the Nd:YAG laser.

Figure 7F:
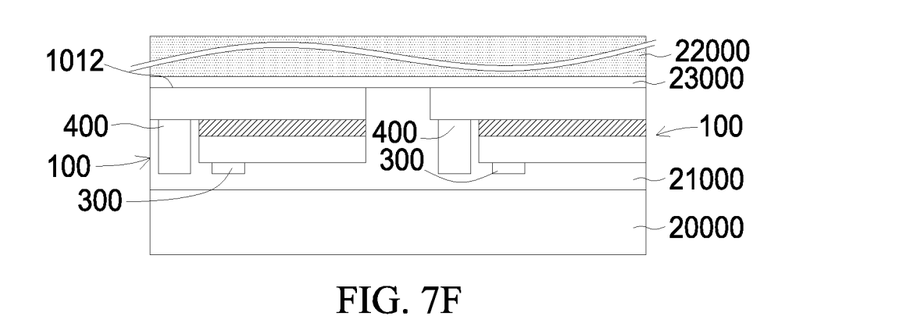

Then, as shown in FIG. 7F, an optional adhesive layer 23000 such as $SiO_2$ or $SiN_x$, and a supporting layer 22000 are formed on the bottom surfaces 1012 of the semiconductor stacks 100. In one embodiment, the optional adhesive layer 23000 is a 150 nm $SiN_x$ layer and the supporting layer 22000 is a 60 μm epoxy based photoimageable polymer which has a thermal expansion coefficient of 56 ppm/° C. and a Young's modulus of 2.4 GPa. The optional adhesive layer 23000 covers the bottom surfaces 1012 and the exposed portions of the bonding layer 21000 by Plasma Enhanced Chemical Vapor Deposition (PECVD). The supporting layer 22000 covers the bottom surfaces 1012 and the exposed portions of the bonding layer 21000 by spin coating and curing. The optional adhesive layer 23000 here is optionally used to increase the adhesive strength between the semiconductor stack 100 and the supporting layer 22000.

Figure 7G:
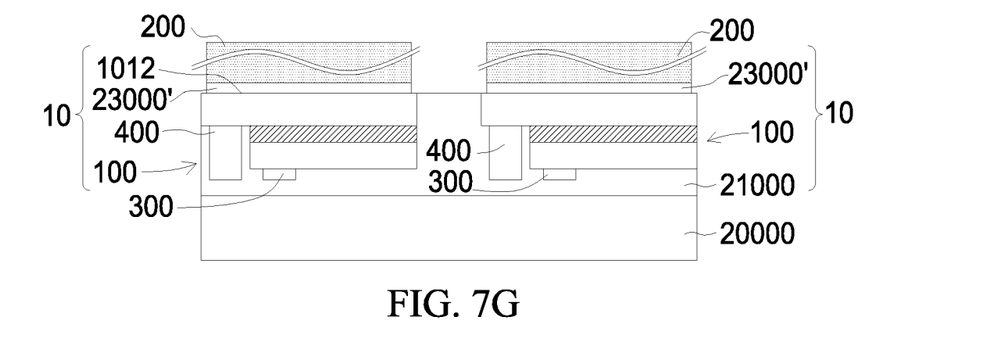

As shown in FIG. 7G, the optional adhesive layer 23000 and the cured supporting layer 22000 shown in FIG. 7F are singulated to be the patterned optional adhesive layer 23000' and the patterned supporting layers 200 by photolithography, respectively. A plurality of light-emitting devices 10 are then made flipping on the first temporary carrier 20000 with the bonding layer 21000 formed therebetween. In one embodiment, the optional adhesive layer 23000 is a transparent or translucent layer.

Figure 7H:
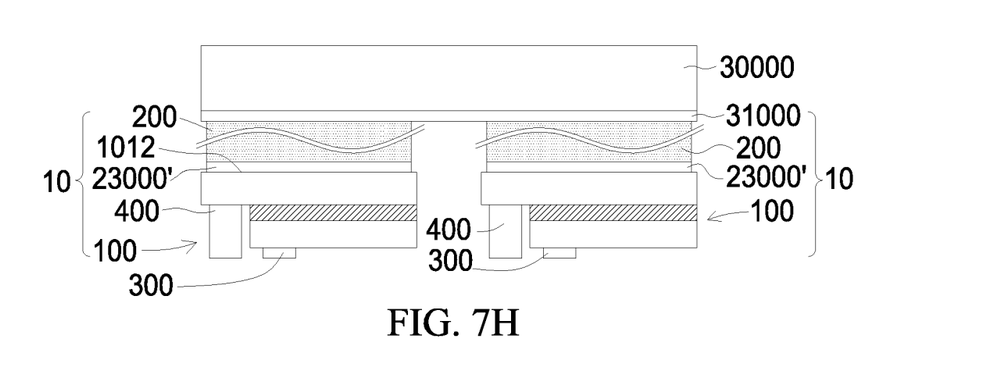

As shown in FIG. 7H, a second temporary carrier 30000 is provided. The second temporary carrier 30000 can optionally include a sticky layer 31000, such as UV tape, on the bottom surface thereof. After the plurality of light-emitting devices 10 are then bonded to the sticky layer 31000, the bonding layer 21000 and the first temporary carrier 20000 are removed. In one embodiment, after bonding the plurality of light-emitting devices 10 to the second temporary carrier 30000 through the sticky layer 31000, the first temporary carrier 20000 is separated from the plurality of light-emitting devices 10 by a laser lift-off. The bonding layer 21000 are then removed by a plasma etching. The material of the sticky layer includes not limited to BCB, PI, silicone, Polydimethylsiloxane (PDMS), Anisotropic Conductive Film (ACF) . . . and so on. The laser is selected to have a wavelength capable of being absorbed by the bonding layer. In one embodiment, the laser has a wavelength less than 325 nm absorbable by BCB as the bonding layer.

Finally, removing the light-emitting devices 10 from the second temporary carrier 30000 by either a pick-and-place step or a mass-transfer step, the light-emitting device 10 as shown in FIGS. 1A and 1B is formed.

In another embodiment, the manufacturing method further includes a step of forming a second supporting layer to cover the top surfaces of the semiconductor stacks such as the light-emitting device 60 shown in FIG. 4 to protect the semiconductor stacks from the external attack such as the pick-and-place process.

Figure 8A:
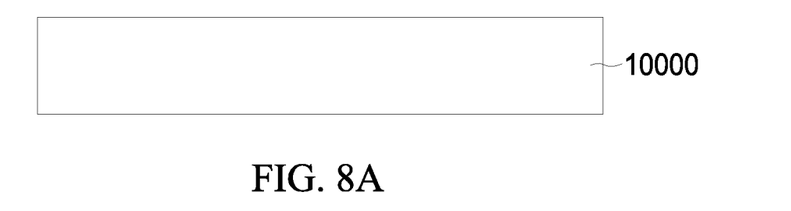
FIGS. 8A~8H show steps of manufacturing the light-emitting device in FIGS. 5A~5B in accordance with embodiments of the present disclosure.
Figure 8B:
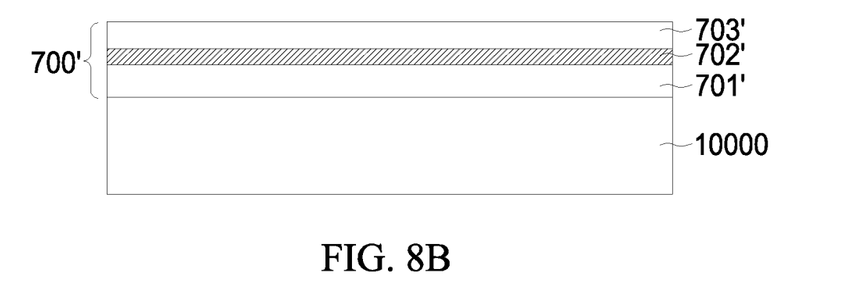
Figure 8C:
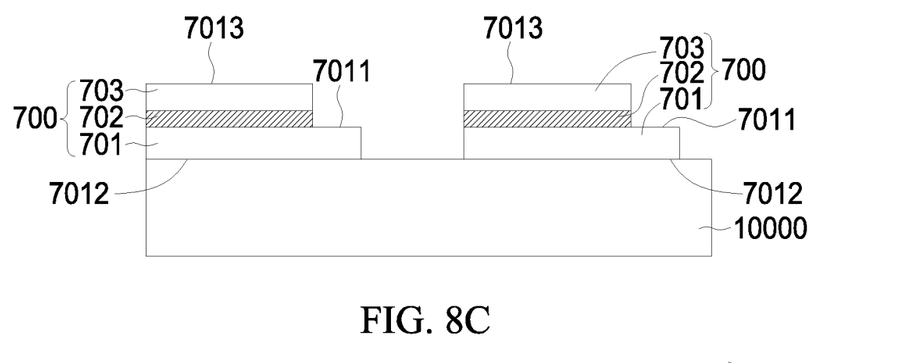
Figure 8D:
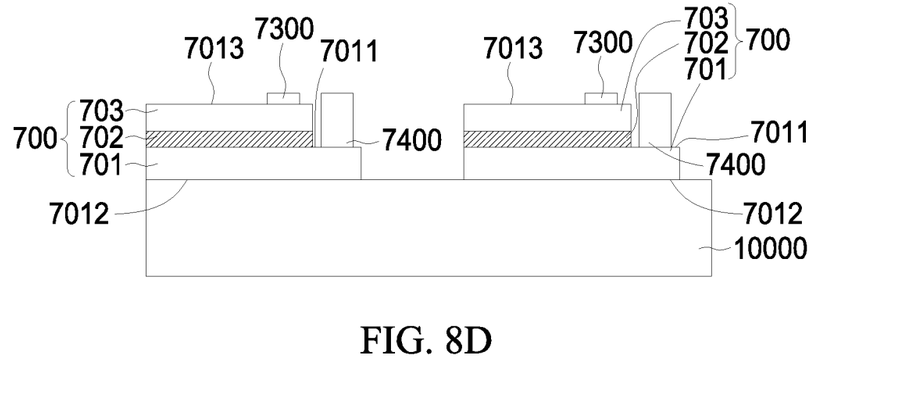

FIGS. 8A-8F show the steps of manufacturing the light-emitting device 70 shown in FIGS. 5A~5B. Referring to FIG. 8A, a substrate 10000 is provided. In one embodiment, the substrate 10000 is made of sapphire. Referring to FIG. 8B, a semiconductor stack 700' is formed on the substrate 10000. In one embodiment, the semiconductor stack 700' is formed through several steps including epitaxially forming a GaN series first semiconductor layer 701' on the substrate 10000 by MOCVD, epitaxially forming a GaN series active layer 702' on the first semiconductor layer 701' by MOCVD, and epitaxially forming a GaN series second semiconductor layer 703' on the active layer 702' by MOCVD. Referring to FIG. 7C, the semiconductor stack 700' is patterned and separated into a plurality of semiconductor stacks 700. In one embodiment, the semiconductor stacks 700 are formed by ICP. Each semiconductor stack 700 includes a first semiconductor layer 701 with a first top surface 7011 and a bottom surface 7012, an active layer 702 located on the first semiconductor layer 701, and a second semiconductor layer 703 located on the active layer 702 and having a second top surface 7013. Referring to FIG. 8D, a first electrode 7300 is formed on the first top surface 7011, and a second electrode 7400 is formed on the second top surface 7013. In one embodiment, the first electrode 7300 and the second electrode 7400 are formed on the first semiconductor layer 701 and the second semiconductor layer 703 by E-beam Evaporation, respectively.

Figure 8E:
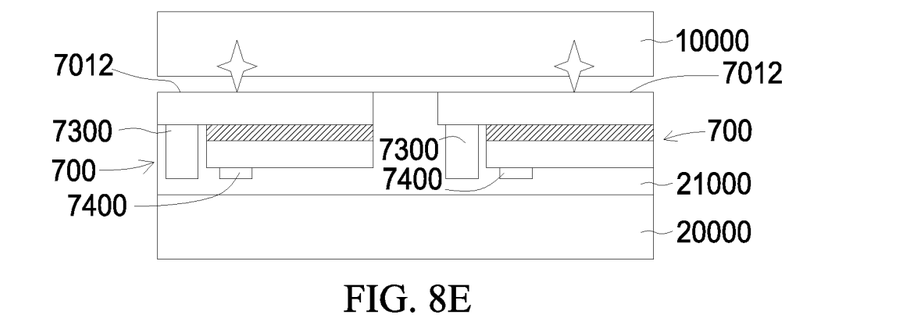

Referring to FIG. 8E, a first temporary carrier 20000 with a top surface is provided. A bonding layer 21000 is provided to cover all the top surface. The plurality of semiconductor stacks 700 formed on the substrate 10000 are bonded to the bonding layer 21000. The semiconductor stacks 700 are separated from the substrate 10000 through a laser lift-off process by irradiating the interface between the substrate 10000 and the semiconductor stacks 700 with laser beams. In one embodiment, GaN series semiconductor stacks 700 are separated from the substrate 10000 by using an Nd:YAG third harmonic laser to irradiate the interface therebetween with laser beams having a wavelength of 355 nm through the substrate 10000. The GaN series semiconductor stacks 700 are bonded onto a bonding layer 21000 such as BCB layer, and the bottom surfaces 7012 of each GaN series semiconductor stacks 700 are exposed.

Figure 8F:
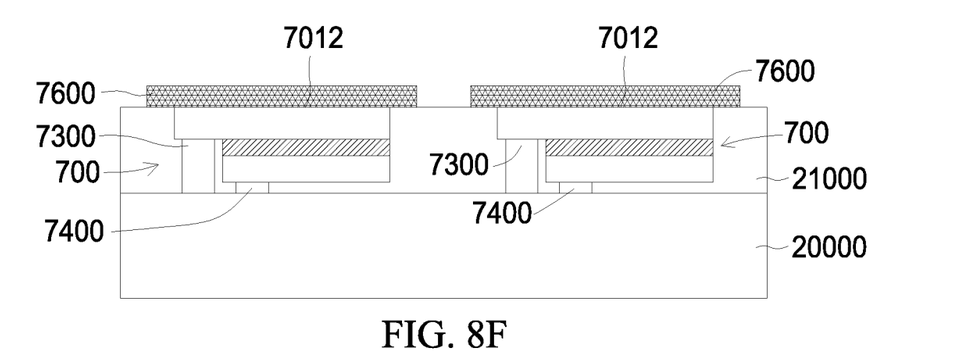

Referring to FIG. 8F, after the semiconductor stacks 700 is bonded to the first temporary carrier 20000 with the bonding layer 21000, a plurality of wavelength conversion layers 7600 is formed on respective bottom surfaces 7012 of the semiconductor stacks 700. In one embodiment, the wavelength conversion layers 7600 includes a kind of 6 μm quantum dot photoresist. The quantum dot photoresist can be formed on the bottom surface 7012 of the semiconductor stacks 700 by steps including spin coating the photoresist to cover all the bottom surfaces 7012, removing some of the photoresist to expose portions of the bonding layer 21000, curing the photoresist, and patterning the photoresist into a plurality of wavelength conversion layers 7600 by photolithography. To achieve the required wavelength converting efficiency (the optical density value (OD value) is larger than 1 after the light emitted by the semiconductor stack passing through the wavelength conversion layer), each wavelength conversion layer 7600 encompasses the bottom surface 7012 of the corresponding semiconductor stack 700 and has a thickness of at least 2 m, as shown in FIG. 8F.

Figure 8G:
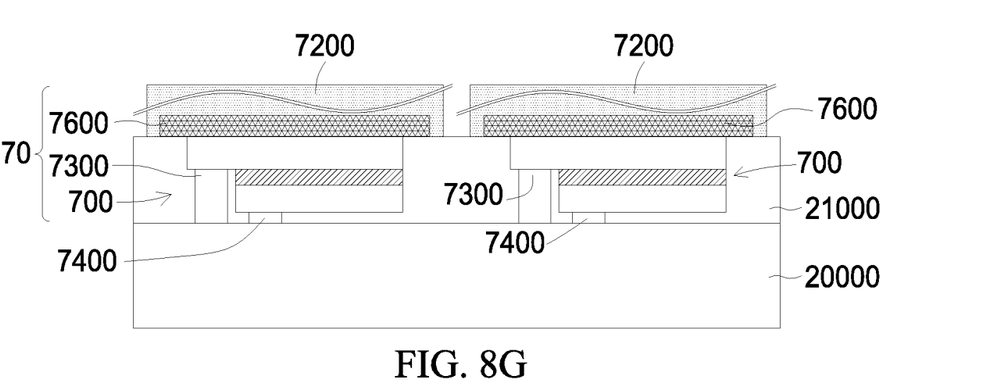

Referring to FIG. 8G, the supporting layers 7200 are formed to cover the respective wavelength conversion layers 7600. That is, the wavelength conversion layer 7600 is formed between the semiconductor stack 700 and a supporting layer 7200. In one embodiment, a 50 μm epoxy based photoimageable polymeric supporting layer (not shown) with a thermal expansion coefficient of 56 ppm/° C. and a Young's modulus of 2.4 GPa is formed by spin coating to fully cover the wavelength conversion layers 7600 and exposing the top surfaces of the bonding layer 21000. After being cured, the supporting layer (not shown) is patterned into a plurality of supporting layers 7200 by photolithography. The supporting layers 7200 are formed on the wavelength conversion layers 7600, respectively. Therefore, the light-emitting devices 70 are flipped on the first temporary carrier 20000 with the bonding layer 21000 formed therebetween.

Figure 8H:
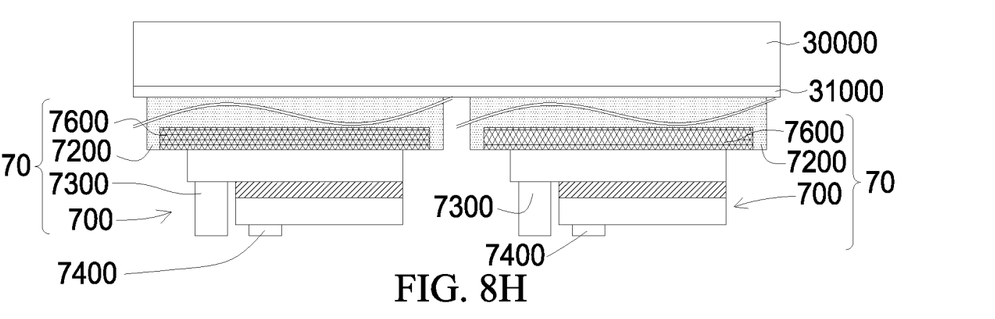

As shown in FIG. 8H, a second temporary carrier 30000 is provided. The second temporary carrier 30000 can optionally include a sticky layer 31000. The plurality of light-emitting devices 70 are then bonded to the sticky layer 31000. The bonding layer 21000 and the first temporary carrier 20000 are then removed. In one embodiment, after bonding the plurality of light-emitting devices 70 to a second temporary carrier 30000 through a UV tape as the sticky layer 31000, the first temporary carrier 20000 is separated by using a laser irradiation, and the bonding layer 21000 such as BCB, is then removed by a plasma etching. The material of the sticky layer includes but not limited to BCB, PI, silicone, PDMS, ACF . . . and so on. The laser should have the energy which can be absorbed by the bonding layer. In one embodiment, the laser has a wavelength less than 325 nm absorbable by BCB as the bonding layer.

Furthermore, an adhesive layer (not shown) can be optionally formed between the semiconductor stack and the wavelength conversion layer and/or between the wavelength conversion layer and the supporting layer in order to enhance the adhesive strength therebetween according to the demand. The material of the adhesive layer is selected from $SiO_2$, $SiN_x$ . . . and so on. The thickness of the adhesive layer is between 150~500 nm. The adhesive layer is a transparent or translucent layer.

Finally, moving the light-emitting devices 70 from the second temporary carrier 30000 by either a pick-and-place step or a mass-transfer step, the light-emitting device 70 as shown in FIGS. 5A and 5B is formed.

In another embodiment, the manufacturing method further includes a step of forming a second supporting layer to cover the side surfaces of the semiconductor stacks such as the light-emitting device 80 shown in FIGS. 6A and 6B to protect the wavelength conversion layer from being exposed.

In the present disclosure, because the supporting layers of the semiconductor stacks can be formed by photolithography or dry etching, the side walls of the light-emitting devices are flat and can be adjusted according to the requirement. The light-emitting devices with flatter sidewalls perpendicular to the bottom surface of the semiconductor stack have an improved light extraction and uniform light patterns, especially for the light-emitting device in the micrometer scale.

Although the present disclosure has been explained above, it is not the limitation of the range, the sequence in practice, the material in practice, or the method in practice. Any modification or decoration for present disclosure is not detached from the spirit and the range of such.

What is claimed is:

1. A light-emitting device, comprising:
    a semiconductor stack comprising:
        a first semiconductor layer, comprising a first top surface and a bottom surface;
        an active layer located on the first semiconductor layer; and
        a second semiconductor layer located on the active layer and comprising
    a second top surface;
    a first electrode located on the first top surface;
    a second electrode located on the second top surface; and
    a first supporting layer comprising a first thickness, a first surface, and a second surface opposite to the first surface, and connected to the bottom surface via the first surface to cover at least 80% area of the bottom surface, wherein the first thickness is measured from the first surface to the second surface;
    wherein, in a top view, the semiconductor stack comprises a maximum length, and a ratio of the maximum length to the first thickness is smaller than 1; and
    wherein the first supporting layer comprises a first thermal expansion coefficient smaller than 80 ppm/° C., and a Young's modulus between 2~10 GPa.

2. The light-emitting device according to claim 1, wherein, in the top view, the semiconductor stack comprises a boundary located outside the first supporting layer.

3. The light-emitting device according to claim 2, further comprising a second supporting layer covering the second top surface, and wherein the second supporting layer comprises a second thickness and a second thermal expansion coefficient, the second thickness is smaller than the first thickness, and the second thermal expansion coefficient is larger than the first thermal expansion coefficient.

4. The light-emitting device according to claim 1, wherein, the first supporting layer is a solid layer.

5. The light-emitting device according to claim 1, wherein the first supporting layer is a hollow layer comprising openings under the bottom surface.

6. The light-emitting device according to claim 5, further comprising a second supporting layer covering the second top surface, and wherein the second supporting layer comprises a second thickness and a second thermal expansion coefficient, the second thickness is smaller than the first thickness, and the second thermal expansion coefficient is larger than the first thermal expansion coefficient.

7. The light-emitting device according to claim 1, wherein the semiconductor stack further comprises a side surface, and the first supporting layer covers the side surface.

8. The light-emitting device according to claim 1, further comprising an adhesive layer located between the semiconductor stack and the first supporting layer, and comprising a thickness between 150~500 nm.

9. The light-emitting device according to claim 1 further comprising:
    a wavelength conversion layer located between the bottom surface and the first supporting layer.

10. The light-emitting device according to claim 9, further comprising a second supporting layer, wherein the semiconductor stack further comprises a side surface, and the second supporting layer covers the side surface.

11. The light-emitting device according to claim 10, wherein the second supporting layer comprises a second thickness and a second thermal expansion coefficient, the second thickness is smaller than the first thickness, and the second thermal expansion coefficient is larger than the first thermal expansion coefficient.

12. The light-emitting device according to claim 10, wherein the first supporting layer comprises a first outer surface, the second supporting layer comprises a second outer surface, and the first outer surface and the second outer surface are coplanar with each other.

13. The light-emitting device according to claim 9, wherein, in the top view, the semiconductor stack comprises a first boundary, the wavelength conversion layer comprises a second boundary, the first supporting layer comprises a third boundary, the second boundary encompasses the first boundary, and the third boundary encompasses the second boundary.

14. The light-emitting device according to claim 1, wherein, in the top view, the first supporting layer comprises a boundary located outside the semiconductor stack.

15. A light-emitting device, comprising:
a semiconductor stack comprising:
   a first semiconductor layer, comprising a first top surface and a bottom surface;
   an active layer located on the first semiconductor layer; and
   a second semiconductor layer located on the active layer and comprising
a second top surface;
a first electrode located on the first top surface;
a second electrode located on the second top surface;
a first supporting layer comprising a first thickness, and covering at least 80% of the bottom surface; and
a second supporting layer covering the second top surface, and wherein the second supporting layer comprises a second thickness and a second thermal expansion coefficient, the second thickness is smaller than the first thickness, and the second thermal expansion coefficient is larger than the first thermal expansion coefficient;
wherein, in a top view, the semiconductor stack comprises a maximum length, and a ratio of the maximum length to the first thickness is smaller than 1; and
wherein the first supporting layer comprises a first thermal expansion coefficient smaller than 80 ppm/° C., and a Young's modulus between 2~10 GPa.

16. The light-emitting device according to claim 15 further comprising an adhesive layer located between the semiconductor stack and the first supporting layer, and comprising a thickness between 150~500 nm.

17. The light-emitting device according to claim 15 further comprising:
a wavelength conversion layer located between the bottom surface and the first supporting layer.

18. The light-emitting device according to claim 15, wherein, in the top view, the semiconductor stack comprises a first boundary, the wavelength conversion layer comprises a second boundary, the first supporting layer comprises a third boundary, the second boundary encompasses the first boundary, and the third boundary encompasses the second boundary.

19. The light-emitting device according to claim 18, wherein the first supporting layer comprises a first outer surface, the second supporting layer comprises a second outer surface, and the first outer surface and the second outer surface are coplanar with each other.

20. The light-emitting device according to claim 15 further comprising a second supporting layer, wherein the semiconductor stack further comprises a side surface, and the second supporting layer covers the side surface.

* * * * *